United States Patent [19]
Gore et al.

[11] Patent Number: 5,528,461
[45] Date of Patent: Jun. 18, 1996

[54] PRINTED CIRCUIT ASSEMBLY HAVING COMPONENT LOCATING FEATURES

[75] Inventors: Kiron Gore, Coral Springs; Edward J. Hall, Miami; John B. Brinkerhoff, Sunrise, all of Fla.

[73] Assignee: Motorola, Inc., Schaumburg, Ill.

[21] Appl. No.: 148,245

[22] Filed: Nov. 8, 1993

[51] Int. Cl.[6] ..................................................... H05K 7/02
[52] U.S. Cl. ........................... 361/760; 361/761; 361/767; 361/810; 228/180.21; 174/263
[58] Field of Search ..................... 361/760, 761, 361/767, 810, 808; 228/180.21, 180.22; 439/83; 174/255, 263, 260

[56] References Cited

U.S. PATENT DOCUMENTS

| | | | |
|---|---|---|---|
| 4,940,181 | 7/1990 | Juskey et al. | 228/180.2 |
| 5,172,852 | 12/1992 | Bernardoni et al. | 228/180.2 |
| 5,282,565 | 2/1994 | Melton | 228/180.22 |
| 5,374,848 | 12/1994 | Otani et al. | 257/685 |

FOREIGN PATENT DOCUMENTS

| | | |
|---|---|---|
| 64-69042 | 3/1989 | Japan . |
| 1251788 | 10/1989 | Japan . |

*Primary Examiner*—Leo P. Picard
*Assistant Examiner*—Young Whang
*Attorney, Agent, or Firm*—Dale W. Dorinski

[57] ABSTRACT

A printed circuit assembly (5) has a surface mount electronic component (14), circuit board (10), and locating features to align (16) the surface mount electronic component on the printed circuit board. The locating features may comprise solder bumps (24) on the printed circuit board. The locating features are arranged on the surface of the printed circuit board to lie proximal to the main body (22) of the surface mount electronic component. The locating features prevent movement of the surface mount electronic component prior to soldering the surface mount electronic component to the printed circuit board.

3 Claims, 4 Drawing Sheets

PRINTED CIRCUIT ASSEMBLY HAVING COMPONENT LOCATING FEATURES

TECHNICAL FIELD

This invention relates in general to circuit carrying substrate assemblies, and more particularly to printed circuit boards having locating features for components.

BACKGROUND

Printed circuit boards have metallized pads or areas that are soldered to component leads or pads. Several methods of soldering are currently used, such as printing solder paste and reflowing the paste, placing solder preforms on the pads and then reflowing the preforms to solder the component in place, mass soldering (wave soldering) the components in place, or providing the solder on the board in reflowed form prior to placing the component. The latter method uses circuit boards that are referred to as "clad". That is, the component pads on the board have a pre-applied quantity of solder already reflowed in place. This process leaves each pad with a domed mass of solder on the pad. Components are then placed on the board, and sometimes they are temporarily held in place with a tacky material such as flux. When parts are placed on these domed structures, they tend to skid off the top of the dome, and become misaligned. This is because the rounded surface of the solder pad presents a non-planar surface for the part, creating an unstable situation. When the components sit on top of the domed structure, small forces exerted on the circuit board by assembly line conveyors or robots cause the part to slide off the pad. This vibration or mechanical bumping can dislodge the part, ultimately creating a defect in the soldered assembly. Such defects appear as shorts and/or unsoldered leads. Heavy or tall components with large mass or high center of gravity overcome the surface tension provided by the tacky flux, that works so well for small parts.

One method of solving this problem has been to mechanically flatten the domed bumps using rollers or heated platens. While this is a viable solution, it is not the most desirable, since it is a secondary operation and adds extra cost to the product.

It would be a desirable addition to the art if one could devise a way to hold the parts in place without the added expense incurred to flatten the domed surfaces of the solder pads.

SUMMARY OF THE INVENTION

Briefly, according to the invention, there is provided a printed circuit assembly, comprising a surface mount electronic component, a printed circuit board, and a locating means for locating the surface mount electronic component on the printed circuit board. The locating means may comprise solder bumps on the printed circuit board. The locating means is arranged on the surface of the printed circuit board to lie proximal to the main body of the surface mount electronic component. The locating means prevents movement of the surface mount electronic component prior to soldering the surface mount electronic component to the printed circuit board.

In an alternate embodiment of the invention, a communications device having a transmitter or receiver has a locating means arranged on the surface of a printed circuit board to lie proximal to the main body of a surface mount electronic component.

DETAILED DESCRIPTION OF THE PREFERRED EMBODIMENT

Figure 1:
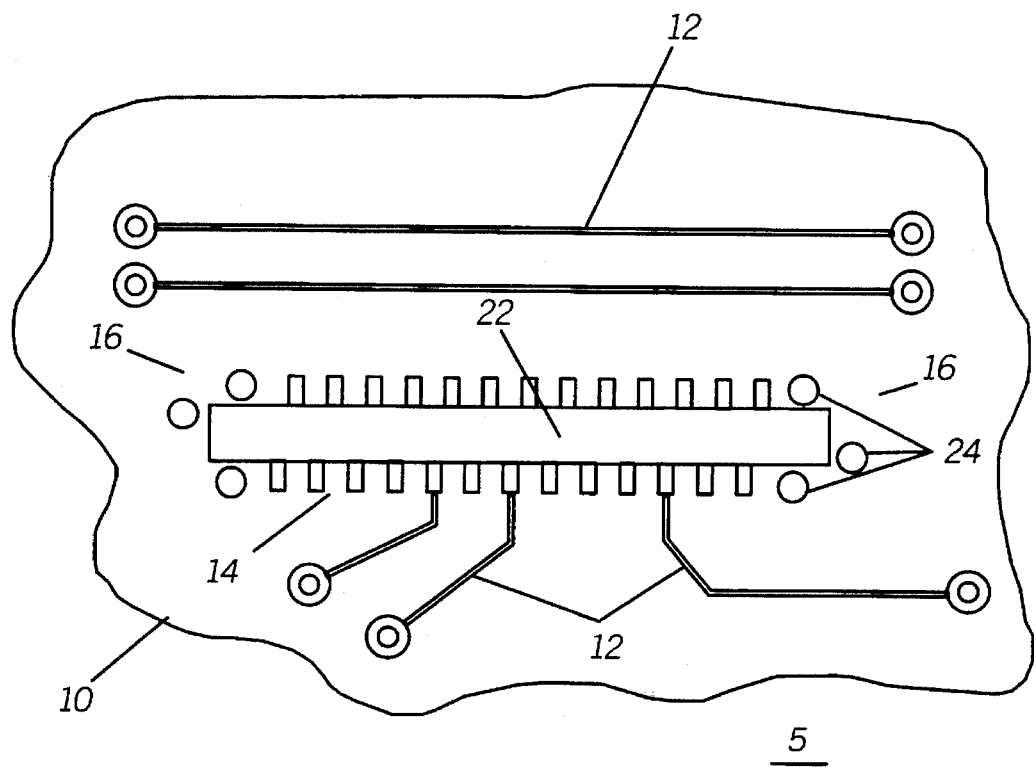
FIG. 1 is a plan view of a printed circuit assembly in accordance with the invention.

While the specification concludes with claims defining the features of the invention that are regarded as novel, it is believed that the invention will be better understood from a consideration of the following description in conjunction with the drawing figures, in which like reference numerals are carried forward. To aid the reader, the sizes of some of the illustrated features are not drawn to scale. Referring now to FIG. 1, a plan view of a circuit assembly 5 in accordance with the present invention is shown. A circuit carrying substrate 10 can be any of a number of types of materials, such as printed circuit boards (PCB) made from glass reinforced resin laminates (FR-4, polyimide, CEM, etc.), ceramics, flex circuits made from flexible films (polyimide, polyester, etc.), or molded circuit boards. The circuit carrying substrate 10 has a circuit pattern 12 comprising a multitude of runners, pads and plated through holes, as found in the conventional art. In addition to the circuit pattern, a series of locating means or features 16 are found on the circuit carrying substrate. These locating features 16 typically comprise a plurality of solder bumps formed on the substrate.

Figure 2:
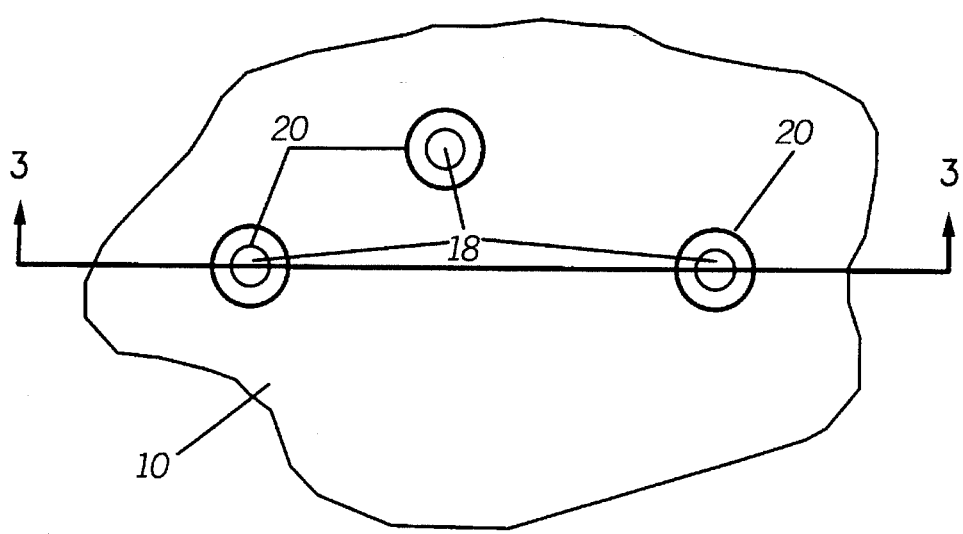
FIG. 2 is a plan view of the locating features in accordance with the present invention.
Figure 3:
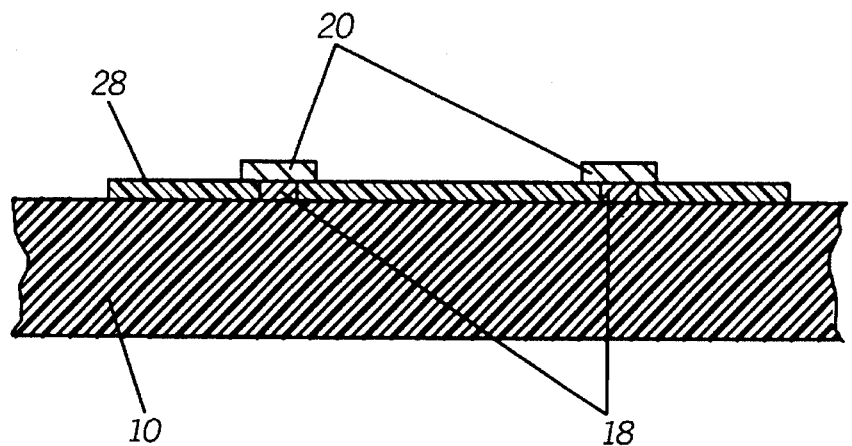
FIG. 3 is a cross-sectional view of FIG. 2 through section 3—3, prior to heating the solder.
Figure 4:
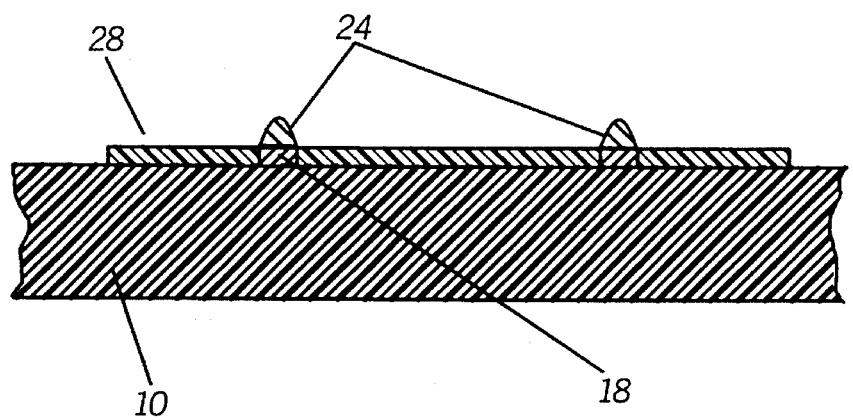
FIG. 4 is a cross-sectional view of FIG. 2 through section 3—3 after the solder has been heated and formed into bumps in accordance with the invention.
Figure 5:
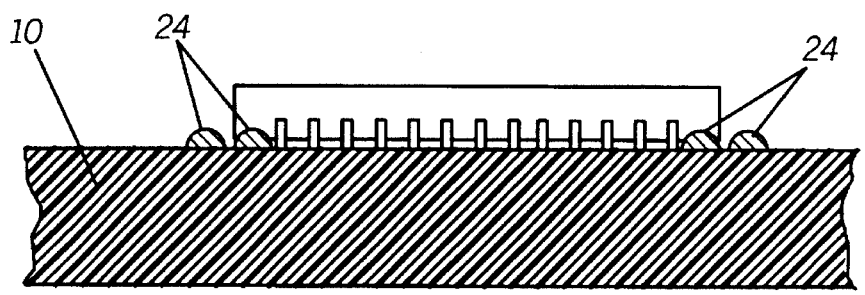
FIG. 5 is an elevational view of a component mounted on a substrate in accordance with the invention.

The formation of the locating features 16 will now be explained with reference to FIGS. 2–4. During the process of defining the circuit pattern on the circuit carrying substrate 10, the locating features are also defined. Typically, the locating features are formed by first defining a series of small, circular pads 18 on the surface of the substrate. In the case of a PCB, the pads are made from copper that is laminated to the surface of the substrate and then etched. The finished PCB would then have bare copper pads 18 and the bare copper circuit pattern. The size of the pads 18 can vary with the exact requirements of the user, further dictated by the size and mass of the component being placed on the PCB. In the preferred embodiment, a 0.75 mm diameter pad is used in conjunction with, for example, a 26 pin ZIF (Zero Insertion Force) connector or a 32 pin TSOP (Thin Small Outline Package). It is well known in the art that solder is used to attach components to a PCB, the solder being applied in numerous ways. For example, it can be printed, stenciled, or otherwise dispensed on the pads using solder paste, using solder preforms, or it can be applied to the PCB by mass soldering (wave soldering or hot air reflow). The latter process ends up producing a PCB that is known in the art as a solder clad board, or simply "clad". This type of PCB then has a thick coating of solder on the copper runners and pads 18, and requires no further addition of solder to attach the components. Components are typically assembled to the clad boards by providing a tacky flux on the PCB at each site where a component is to be attached. The flux then provides fluxing action to cause the solder to wet to the component during the reflow process.

In order to add height to the locating feature, an excess of solder is applied to the pads 18. The solder is typically applied in a pattern 20 that is 2–3 times the area of the bare copper pad 18. In some cases, a layer of solder resist 28, for example, is applied to the PCB, but this is not a requirement and the pattern 20 may be applied directly to the pads 18. For example, the 0.75 mm diameter pad described above would have an applied solder pattern of 1.25 mm diameter. Obviously, this would significantly overlap the metal pad, as shown in FIGS. 2 and 3, but during the reflow process, when the solder melts, surface tension forces cause the solder to be attracted to the metal perimeter of the pad, thereby causing the 1.25 mm diameter solder pattern to contract to 0.75 mm. Since the excess solder must be preserved, the pattern gets taller, creating the solder bumps 24 shown in FIG. 3. In the instant case, the resulting solder bumps are about 0.6 mm high. Restated, when the molten solder pattern is larger than the metal pad underneath it, surface tension forces will pull all the molten solder towards the center of the metal pad and create a tall symmetric dome of solder. When the solder cools and solidifies, hemispherical domes or bumps 24 are created, as shown in FIG. 3.

Referring back to FIG. 1, an electrical component 14 is then mounted on the circuit carrying substrate 10 and is electrically connected to the circuit pattern 12 by solder, conductive epoxy, or other means. The electrical component 14 is typically a surface mount device (SMD) such as a chip carrier, a molded plastic integrated circuit (IC) package (quad flat pack, J-lead, small outline IC, transistor, diode, etc.), a ceramic IC package, a chip resistor, capacitor, inductor, an air wound coil, a connector, or other type of surface mountable device. The locating features 16 are arranged on the PCB such that they will lie proximal to the body 22 of the component. "Proximal" is defined to mean "close or near to the body or part of the body". The locating features 16 exemplified in FIGS. 1 and 3 comprise two patterns of three bumps each, but can be of many other configurations. The bumps 24 serve to create a 'fence' or retaining means for the component 14. When the component 14 is placed on the board, the bumps 24 serve to guide the component into the desired position, and also serve as a retaining means to prevent movement of the component prior to solder reflow. The bumps serve as alignment features, that help to increase the accuracy of the component placement process. Robots cannot typically achieve better that 0.05 mm accuracy, and this can be aided by the use of the locating features. It has been found that the locating features 16 are best arranged to be about 0–0.2 mm away from the body 22 of the component, with 0.07–0.15 mm being the optimum range, but other configurations may also be helpful. Obviously, the bumps should not be closer than 0 mm from the component, and as they are distanced from the component, their effectiveness will begin to diminish at some point. The exact location and number of bumps that provide the optimum results will of course be a function of the individual situation.

Figure 6:
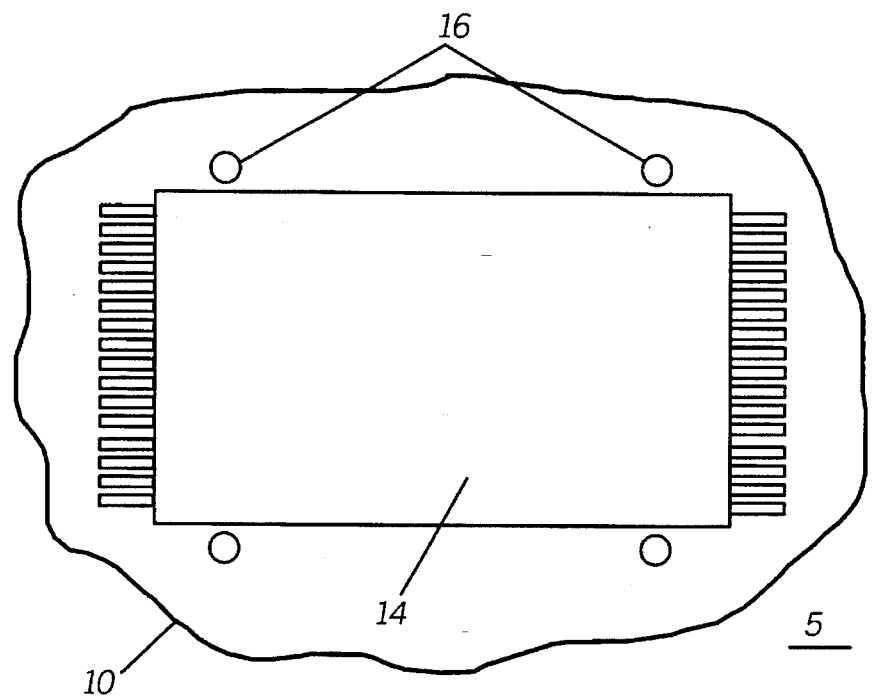
FIG. 6 is a plan view of a printed circuit assembly in an alternate embodiment of the invention.
Figure 7:
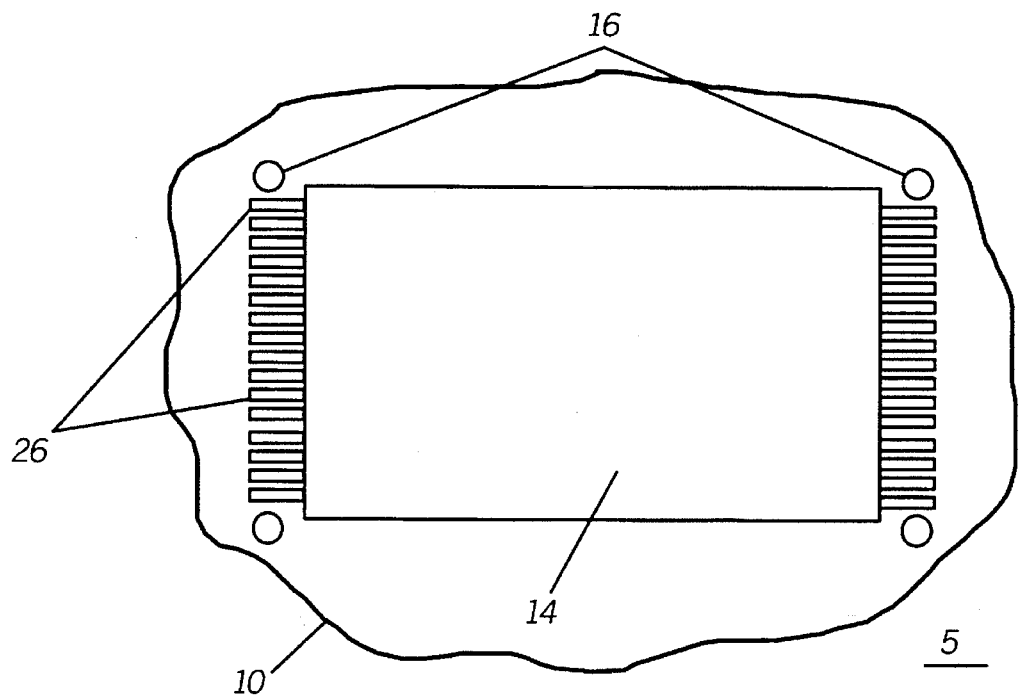
FIG. 7 is a plan view of a printed circuit assembly in another embodiment of the invention.

Referring now to FIG. 6, one alternate embodiment of the invention utilizes a series of four locating features 16 to guide and retain the electrical component 14 into place on the circuit carrying substrate 10. In this case, the component is a TSOP, and the locating features are only on two sides of the body of the part. Another embodiment is shown in FIG. 7 where the locating features 16 serve to guide the part into place using the leads 26 rather than the body of the part.

Figure 8:
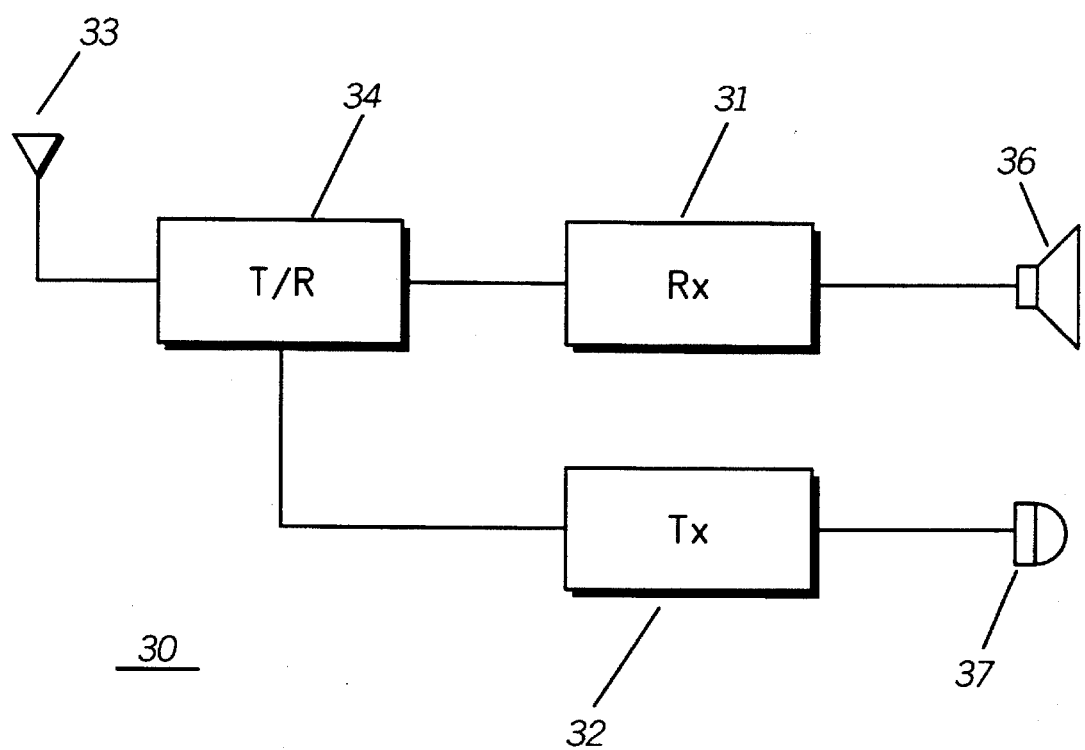
FIG. 8 is a block diagram of a communication device in accordance with the invention.

The printed circuit assembly of the instant invention will find use in a multitude of electronics applications, but especially so in the field of radio communications. Referring to FIG. 8, the locating features of the present invention are utilized in a radio 30 comprising any well-known radio, such as portable two-way radios manufactured by Motorola Inc., which may operate in either receive or transmit modes. The radio 30 includes a receiver section 31 and a transmitter section 32 which comprise means for communicating, that is, transmitting or receiving communication signals for the radio.

In the receive mode, the portable radio 30 receives a communication signal via an antenna 33. A transmit/receive (T/R) switch 34 couples the received communication signal to the receiver 31. The receiver 31 receives and demodulates the received communications signal and presents its audio component to a speaker 36. It may be appreciated by one of ordinary skill in the art that other functions not herein described may be provided by any suitable means, including a controller means (not shown), which controls the entire operation of the radio 30.

In the transmit mode, audio messages are coupled from a microphone 37, where they are used to modulate a carrier signal as is well-known in the art. The modulated carrier signal is then applied to the antenna 33 through the T/R switch 34 for transmission of the communication signal. It may be appreciated that the printed circuit assembly with locating features, according to the principals of the present invention, may be utilized in suitable sections of the transmitter or receiver sections 32 and 31, respectively.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A printed circuit assembly, comprising:
   a surface mount electronic component, having a main body, and mounted on a major surface of a printed circuit board;
   locating means comprising solder bumps that are applied to the printed circuit board prior to mounting the surface mount electronic component on the major surface of the printed circuit board, for locating the surface mount electronic component on the printed circuit board; and
   the solder bumps attached to and arranged on the printed circuit board major surface to lie proximal to the main body of the surface mount electronic component.

2. A printed circuit assembly, comprising:
   a surface mount electronic component having a main body, and mounted on a major surface of a printed circuit board;
   locating means attached to and arranged on the printed circuit board major surface to lie proximal to the main body of the surface mount electronic component;

the locating means comprising solder bumps that are applied to the printed circuit board prior to mounting the surface mount electronic component on the major surface of the printed circuit board, for locating the surface mount electronic component on the printed circuit board; and the locating means retaining said surface mount electronic component in its mounted position prior to soldering the surface mount electronic component to the printed circuit board.

3. A printed circuit assembly, comprising:

a surface mount electronic component, having a main body, and mounted on a major surface of a printed circuit board;

locating means for locating the surface mount electronic component on the printed circuit board; and the locating means attached to and arranged on the printed circuit board major surface, such that the locating means lies proximal to the main body of the surface mount electronic component and does not contact the surface mount electronic component.

* * * * *